United States Patent
Fu et al.

(10) Patent No.: US 7,485,917 B2
(45) Date of Patent: Feb. 3, 2009

(54) SPLIT GATE FLASH MEMORY CELL AND FABRICATION METHOD THEREOF

(75) Inventors: Ching-Hung Fu, Hsin-Chu (TW); Hung-Kwei Liao, Taoyuan County (TW); Chien-Chung Lu, Taipei County (TW)

(73) Assignee: Promos Technologies Inc., Hsinchu (TW)

( * ) Notice: Subject to any disclaimer, the term of this patent is extended or adjusted under 35 U.S.C. 154(b) by 184 days.

(21) Appl. No.: 11/390,144

(22) Filed: Mar. 28, 2006

(65) Prior Publication Data

US 2007/0093024 A1     Apr. 26, 2007

(30) Foreign Application Priority Data

Oct. 26, 2005   (TW) ............... 94137437 A

(51) Int. Cl.
*H01L 29/788*    (2006.01)
(52) U.S. Cl. .............. 257/315; 438/257; 438/258; 257/E21.68; 257/E21.69
(58) Field of Classification Search ......... 438/257–267; 257/314–321, E21.68, E21.681, E21.69
See application file for complete search history.

(56) References Cited

U.S. PATENT DOCUMENTS

| 6,101,131 | A * | 8/2000 | Chang ............... 365/185.33 |
| 2003/0227047 | A1* | 12/2003 | Hsu et al. ............... 257/314 |
| 2004/0201060 | A1* | 10/2004 | Rudeck et al. ............ 257/315 |
| 2006/0019445 | A1* | 1/2006 | Chen ..................... 438/257 |

* cited by examiner

*Primary Examiner*—Brook Kebede
(74) *Attorney, Agent, or Firm*—Birch, Stewart, Kolasch & Birch, LLP

(57) ABSTRACT

A split gate flash memory cell comprising a semiconductor substrate having a first insulating layer thereon and a floating gate with a first width is disclosed. The cell further comprises a second insulating layer, a control gate and a cap on the floating gate in sequence. The cap layer, the control gate and the second insulating layer have a same second width less than the first width. The cell also comprises a third insulating layer over the semiconductor substrate, the sidewalls of the control gate, the second insulating layer, the floating gate, and the first insulating layer. In addition, an erase gate formed on the third insulating layer is provided.

20 Claims, 4 Drawing Sheets

SPLIT GATE FLASH MEMORY CELL AND FABRICATION METHOD THEREOF

BACKGROUND OF THE INVENTION

1. Field of the Invention

The present invention relates to a fabrication method of a nonvolatile memory, and in particular to a fabrication method of a split gate flash memory with a sharp corner profile.

2. Description of the Related Art

Nonvolatile memory devices comprise EPROM, TV-erasable EPROM, EEPROM, flash memory, or one-time-programmable EPROM.

Gates for a flash memory typically comprise a stack gate or a split gate. A typical stack gate comprises a substrate with a tunneling oxide layer thereon, a polysilicon layer (poly 1) as a floating gate, an ONO (oxide-nitride-oxide) stack, and a polysilicon layer (poly 2) as a control gate formed in sequence. As to a split gate, a polysilicon layer (poly 3) as an erase gate is formed adjacent to one side of the described stack gate.

The split gate flash memory can be erased by Fowler-Nordheim tunneling of electrons from its floating gate through the underlying gate oxide layer to the substrate region, i.e. channel regions, but "over erasure" is likely to happen. The split gate flash memory can also be erased by Fowler-Nordheim tunneling of electrons between gates, namely by Fowler-Nordheim tunneling of electrons from the floating gate (poly 1) to the erase gate (poly 3). However, efficiency of such method of erasure is low.

Accordingly, a flash memory capable of improving erasure efficiency and avoiding over erasure is desirable.

BRIEF SUMMARY OF THE INVENTION

In view of the described problems of the related art, a flash memory capable of improving erasure efficiency and a method of fabricating a floating gate with a sharp corner profile are disclosed by the invention.

One embodiment of the invention discloses a fabrication method of a split gate flash memory cell. The method comprises the following steps. A semiconductor substrate is provided. A first insulating layer, a first conductive layer, a second insulating layer, a second conductive layer, and a cap layer are formed on the semiconductor substrate in sequence. A first etching is performed to remove a portion of the cap layer, a portion of the second conductive layer and a portion of the second insulating layer, and thus, a portion of the surface of the first conductive layer is exposed, wherein the etched cap layer, the etched second conductive layer and the etched second insulating layer have sidewalls that are coplanar. A first sidewall spacer and a second sidewall spacer are formed on the sidewalls of the etched cap layer, the etched second conductive layer and the etched second insulating layer, respectively. A second etching, using the first sidewall spacer and the second sidewall spacer as a mask, is performed to remove a portion of the first conductive layer and a portion of the first insulating layer, and thus, a portion of the surface of the semiconductor substrate is exposed, wherein the etched first conductive layer and the etched first insulating layer have sidewalls that are coplanar. The first sidewall spacer and the second sidewall spacer are stripped. A third insulating layer is formed on the semiconductor substrate and the sidewalls of the etched first conductive layer and the etched first insulating layer. A third conductive layer is formed on the third insulating layer.

According to another embodiment of the invention, a split gate flash memory cell is disclosed, which comprises a semiconductor substrate having a first insulating layer thereon and a floating gate with a first width. The cell further comprises a second insulating layer, a control gate and a cap layer on the floating gate in sequence. The cap layer, the control gate and the second insulating layer have a same second width smaller than the first width. The cell also comprises a third insulating layer over the semiconductor substrate, the sidewalls of the control gate, the second insulating layer, the floating gate, and the first insulating layer. In addition, an erase gate is formed on the third insulating layer.

Due to the width difference between the floating gate and the control gate, namely a sharp corner profile of the floating gate protruding from the bottom edge of the control gate, extra surface increased by sharp corner profile is obtained. Point discharge is likely to occur as the sharp corner profile changes electron distribution thereon. As a result, efficiency of erasing from the floating gate to the erase gate is enhanced.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

A detailed description is given in the following embodiments with reference to the accompanying drawings.

The following description is of the best-contemplated mode of carrying out the invention. This description is made for the purpose of illustrating the general principles of the invention and should not be taken in a limiting sense. The scope of the invention is best determined by reference to the appended claims.

FIGS. 1~7 are cross sections of fabricating a split gate flash memory cell in accordance with an embodiment of the invention.

Figure 1:
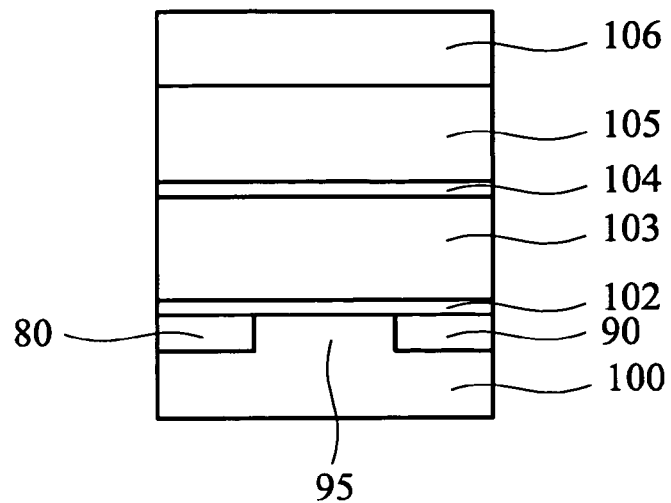
FIGS. 1~7 show cross sections of fabricating a split gate flash memory cell in accordance with an embodiment of the invention.

As shown in FIG. 1, a P-type semiconductor substrate 100 comprising an N-type source region 80, an N-type drain region 90, and a channel region 95 therebetween is provided. A first insulating layer 102, a first conductive layer 103, a second insulating layer 104, a second conductive layer 105, and a cap layer 106 are formed on the semiconductor substrate 100 in sequence. In other embodiments, the source region 80 and the drain region 90 may be formed after formation of the gate structure.

The first insulating layer 102 is formed by, for example, chemical vapor deposition (CVD), plasma enhanced CVD (PECVD) or thermal oxidation. The first insulating layer 102 may be a silicon oxide layer, and its thickness may be between 80 and 100 angstroms.

The second insulating layer 104 is formed by, for example, CVD, PECVD or thermal oxidation. The second insulating layer 104 may be an ONO stack.

The first conductive layer 103 and the second conductive layer 105 are formed by, for example, CVD, and materials thereof may be polysilicon or doped polysilicon. The thickness of the first conductive layer 103 is between 1500 and 2500 angstroms. The thickness of the second conductive layer 105 is between 1500 and 2000 angstroms.

The cap layer 106 is formed by, for example, CVD, and the thickness thereof is between 1000 and 2000 angstroms. The cap layer 106 may be a silicon nitride layer.

Figure 2:
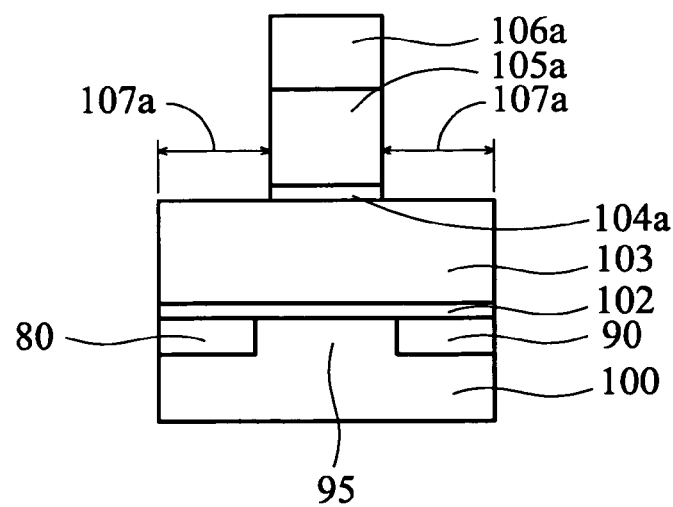

As shown in FIG. 2, the cap layer 106, the second conductive layer 105 and the second insulating layer 104 are patterned. For instance, a photolithography and an etching process are performed in sequence. A portion of the cap layer 106, a portion of the second conductive layer 105 and a portion of the second insulating layer 104 are etched; thus, partial surface 107a of the first conductive layer 103 is exposed. In the intervening time, a portion of the cap layer 106a, a portion of the second insulating layer 104a and a portion of the second conductive layer 105 as a control gate 105a remain. Sidewalls of the remaining cap layer 106a, control gate 105a and second insulating layer 104a are coplanar. The described etching comprises an anisotropic etching.

Figure 3:
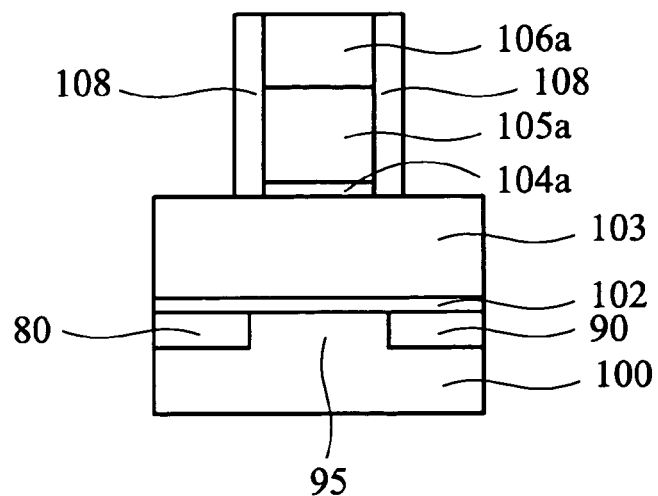

As shown in FIG. 3, a layer of insulating materials (not shown) is formed by means of LPCVD or PECVD. The insulating layer is etched to form a sidewall spacer 108 on sidewalls of the cap layer 106a, the control gate 105a and the second insulating layer 104a. The sidewall spacer 108 may be a silicon nitride layer, and the thickness thereof is between 50 and 400 angstroms. The thickness of the sidewall spacer 108 determines the width difference 109a (referred to FIG. 5) between the subsequent floating gate 103a (referred to FIG. 4) and the control gate 105a.

Figure 4:
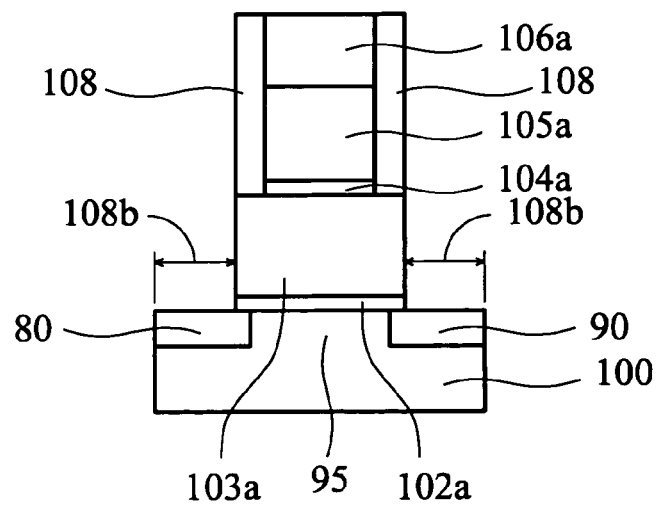

As shown in FIG. 4, using the sidewall spacer 108 and the cap layer 106a as a mask, an etching process is performed to remove the first conductive layer 103 and the first insulating layer 102, and thus, a portion of surface 108b of the semiconductor substrate 100 is exposed. In the intervening time, a portion of the first insulating layer 102a and the first conductive layer 103 as a floating gate 103a remain. Sidewalls of the first insulating layer 102a and the floating gate 103a are coplanar.

Figure 5:
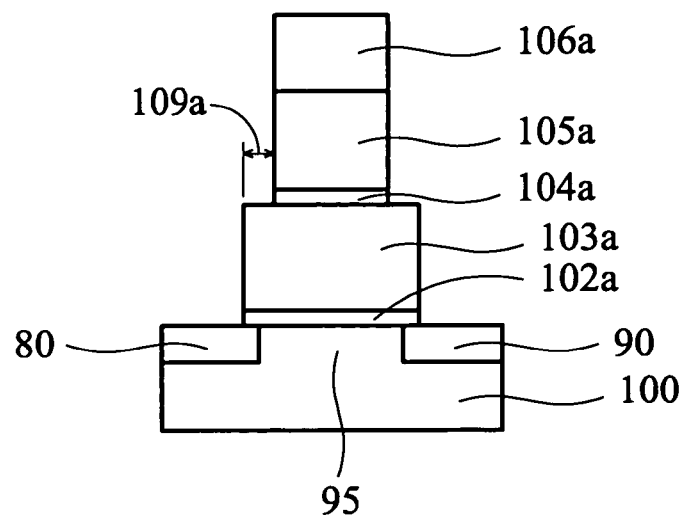

As shown in FIG. 5, the sidewall spacer 108 is stripped.

Figure 6:
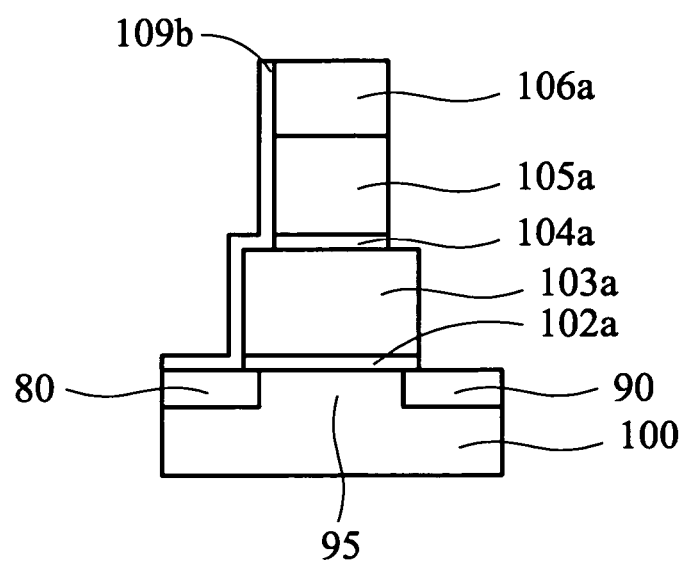

As shown in FIG. 6, by means of CVD, a third insulating layer 109b is conformally formed on the semiconductor substrate 100 and the sidewalls of the cap layer 106a, of the control gate 105a, of the second insulating layer 104a, of the floating gate 103a, and of the first insulating layer 102a. The third insulating layer 109b may be a silicon oxide layer, and the thickness thereof is between 50 and 400 angstroms. In other embodiments, a thermal oxidation can be performed to intense the third insulating layer 109b after the described CVD.

Figure 7:
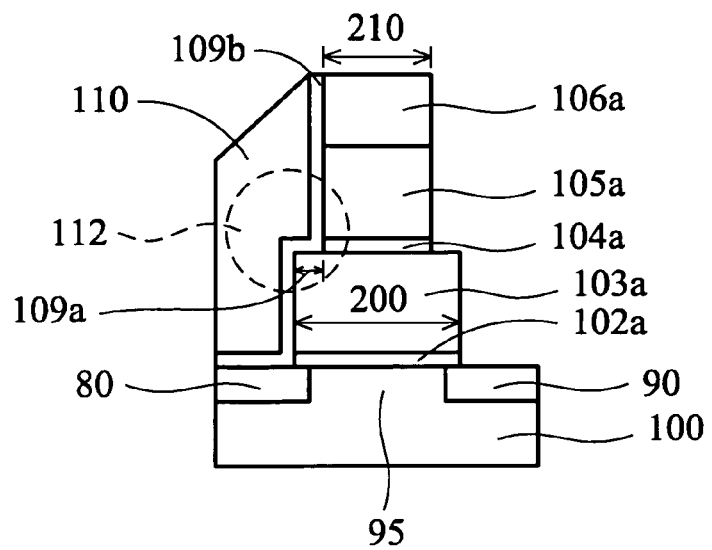

As shown in FIG. 7, a conductive sidewall spacer is formed adjacent to the described structure. Formation of the conductive sidewall spacer comprises deposition of a third conductive layer (not shown) on the third insulating layer 109b. The third conductive layer may be a doped polysilicon layer formed by means of CVD, and its thickness is between 2000 and 3000 angstroms. Thereafter, the conductive sidewall spacer as an erase gate 110 is formed by an anisotropic etching.

According to the described method, a split gate flash memory cell is disclosed, which comprises a semiconductor substrate 100 having a first insulating layer 102a thereon and a floating gate 103a on the first insulating layer 102a. The first insulating layer 102a and the floating gate 103a have a same first width 200. The cell further comprises a second insulating layer 104a, a control gate 105a and a cap layer 106a on the floating gate 103a in sequence. The cap layer 106a, the control gate 105a and the second insulating layer 104a have a same second width 210 smaller than the first width 200. The cell also comprises a third insulating layer 109b over the semiconductor substrate 100, the sidewalls of the control gate 105a, the second insulating layer 104a, the floating gate 103a, and the first insulating layer 102a. In addition, an erase gate 110 is formed on the third insulating layer 109b.

Figure 8:
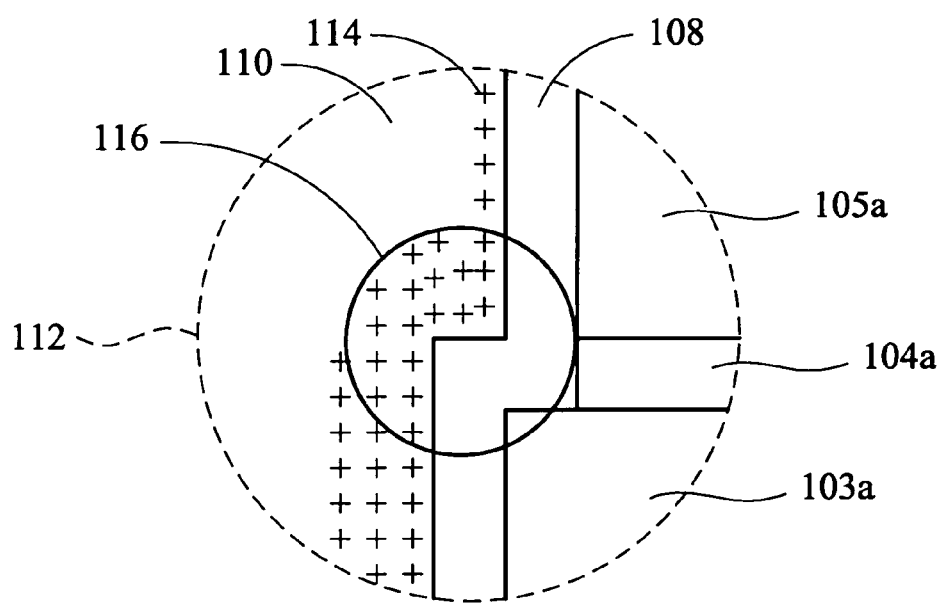
FIG. 8 is a partial enlarged view of the split gate flash memory cell shown in the FIG. 7.

As shown in FIG. 8 (an enlarged view 112 of FIG. 7), a sidewall spacer with an appropriate thickness is employed to create a width difference 109a, i.e. a sharp corner protruding from the bottom edge of the control gate 105a is formed on the upper corner of the floating gate 103a. An extra surface created by the sharp corner profile is thus obtained, so that point discharge 116 is likely to occur as the sharp corner profile changes electrons 114 distribution thereon. As a result, efficiency of erasing from the floating gate 103a to the erase gate 110 is enhanced. In addition, the third insulating layer 109b is an oxide layer conformally formed adjacent to the floating gate 103a and the control gate 105a, so that performance of the device will not be affected due to less electrons trapped therein when it is programmed.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of fabricating a split gate flash memory cell, comprising:

providing a semiconductor substrate;

forming a first insulating layer, a first conductive layer, a second insulating layer, a second conductive layer, and a cap layer on the semiconductor substrate in sequence;

performing a first etching process to remove a portion of the cap layer, a portion of the second conductive layer and a portion of the second insulating layer to expose a portion of the surface of the first conductive layer, wherein the etched cap layer, the etched second conductive layer and the etched second insulating layer have coplanar sidewalls;

forming a first sidewall spacer and a second sidewall spacer on the sidewalls of the etched cap layer, the etched second conductive layer and the etched second insulating layer, respectively;

performing a second etching, with the first sidewall spacer and the second sidewall spacer as a mask, to remove a portion of the first conductive layer and a portion of the first insulating layer, and thus, a portion of a surface of the semiconductor substrate is exposed, wherein the etched first conductive layer and the etched first insulating layer have coplanar sidewalls;

striping the first sidewall spacer and the second sidewall spacer;

forming a third insulating layer on the semiconductor substrate and the sidewalls of the etched first conductive layer and the etched first insulating layer; and forming a third conductive layer on the third insulating layer.

2. The method as claimed in claim 1, wherein the first sidewall spacer and the second sidewall spacer comprise silicon nitride.

3. The method as claimed in claim 1, wherein the third insulating layer comprises silicon oxide.

4. The method as claimed in claim 1, wherein forming the third insulating layer comprises performing chemical vapor deposition.

5. The method as claimed in claim 1, wherein the first conductive layer, the second conductive layer and the third conductive layer comprise polysilicon.

6. The method as claimed in claim 1, wherein the second insulating layer comprises an oxide-nitride-oxide stack.

7. The method as claimed in claim 1, wherein forming the third insulating layer comprises performing thermal oxidation.

8. A split gate flash memory cell, comprising:
a semiconductor substrate;
a first insulating layer on the semiconductor substrate;
a floating gate on the first insulating layer, wherein the floating gate has a first width;
a second insulating layer on the floating gate;
a control gate on the second insulating layer;
a cap layer on the control gate, wherein the cap layer, the control gate and the second insulating layer have a same second width less than the first width;
a third insulating layer conformally disposed on and in direct contact with sidewalls of the cap layer, the control gate, the second insulating layer, and the floating gate; and
an erase gate on the third insulating layer.

9. The split gate flash memory cell as claimed in claim 8, wherein the floating gate and the first insulating layer have the same first width.

10. The split gate flash memory cell as claimed in claim 8, wherein the cap layer comprises silicon nitride.

11. The split gate flash memory cell as claimed in claim 8, wherein the difference between the first width and the second width ranges from 50 to 400 angstroms.

12. The split gate flash memory cell as claimed in claim 8, wherein the floating gate, the control gate and the erase gate comprise polysilicon.

13. The split gate flash memory cell as claimed in claim 8, wherein the third insulating layer comprises silicon oxide.

14. The split gate flash memory cell as claimed in claim 8, wherein the second insulating layer comprises an oxide-nitride-oxide stack.

15. A method of fabricating a split gate flash memory cell, comprising:
forming a first conductive layer on a substrate;
forming a first insulating layer on the first conductive layer;
forming a second conductive layer on the first insulating layer;
forming a patterned cap layer on the second conductive layer;
using the cap layer as a mask to remove a portion of the second conductive layer and a portion of the first insulating layer, and thus, a portion of the surface of the first conductive layer is exposed;
forming a sidewall spacer on sidewalls of the remaining second conductive layer and the remaining first insulating layer;
using the sidewall spacer and the cap layer as a mask to remove a portion of the first conductive layer, and thus, a portion of a surface of the substrate is exposed;
removing the sidewall spacer;
conformally forming a second insulating layer on sidewalls of the remaining second conductive layer, the remaining first insulating layer and the remaining first conductive layer; and
forming a third conductive layer on the second insulating layer.

16. The method as claimed in claim 15, further comprising: treating the second insulating with a thermal oxidation process.

17. The method as claimed in claim 15, wherein the sidewall spacer comprises silicon nitride.

18. The method as claimed in claim 15, wherein the second insulating layer comprises silicon oxide.

19. The method as claimed in claim 15, wherein the first conductive layer, the second conductive layer and the third conductive layer comprise polysilicon.

20. The method as claimed in claim 15, wherein the first insulating layer comprises an oxide-nitride-oxide stack.

* * * * *